(12) United States Patent
Lee et al.

(10) Patent No.: US 7,317,230 B2
(45) Date of Patent: Jan. 8, 2008

(54) FIN FET STRUCTURE

(75) Inventors: Choong-Ho Lee, Gyeonggi-do (KR); Dong-Gun Park, Gyeonggi-do (KR); Jae-Man Youn, Seoul (KR); Chul Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/041,063

(22) Filed: Jan. 21, 2005

(65) Prior Publication Data

US 2005/0173768 A1  Aug. 11, 2005

(30) Foreign Application Priority Data

Feb. 10, 2004 (KR) .................. 10-2004-0008598

(51) Int. Cl.
*H01L 29/94* (2006.01)

(52) U.S. Cl. .............. 257/401; 257/288; 257/347; 257/368; 257/410; 257/E29.022; 257/E29.028; 257/E29.128; 257/E29.13

(58) Field of Classification Search ........... 257/288, 257/213, 296, 347, 368, 401, 410–412, 413, 257/352, E29.028, E29.136, E29.267, 68, 257/E29.022, E29.128, E28.128, E29.13
See application file for complete search history.

(56) References Cited

U.S. PATENT DOCUMENTS

| | | | |
|---|---|---|---|
| 5,619,166 A * | 4/1997 | Gross .................. | 327/552 |
| 5,637,522 A * | 6/1997 | Ikemasu ............... | 438/396 |
| 5,675,164 A | 10/1997 | Brunner et al. | |
| 5,844,278 A * | 12/1998 | Mizuno et al. ......... | 257/345 |
| 6,432,829 B2 | 8/2002 | Muller et al. | |
| 6,525,403 B2 | 2/2003 | Inaba et al. | |
| 6,642,090 B1 * | 11/2003 | Fried et al. ........... | 438/164 |
| 6,765,303 B1 * | 7/2004 | Krivokapic et al. ..... | 257/25 |
| 6,800,905 B2 * | 10/2004 | Fried et al. ........... | 257/351 |
| 6,830,953 B1 * | 12/2004 | Hu et al. .............. | 438/105 |
| 6,919,601 B2 * | 7/2005 | Inaba ................... | 257/347 |
| 6,960,781 B2 * | 11/2005 | Currie et al. ........... | 257/19 |
| 2004/0150029 A1 * | 8/2004 | Lee ...................... | 257/308 |
| 2004/0173812 A1 * | 9/2004 | Currie et al. ........... | 257/103 |
| 2004/0217433 A1 * | 11/2004 | Yeo et al. ............. | 257/412 |
| 2005/0051843 A1 * | 3/2005 | Inaba ................... | 257/347 |
| 2005/0067670 A1 * | 3/2005 | Hui ...................... | 257/529 |
| 2005/0124120 A1 * | 6/2005 | Du et al. .............. | 438/283 |

* cited by examiner

*Primary Examiner*—Minhloan Tran
*Assistant Examiner*—Benjamin Tzu-Hung Liu
(74) *Attorney, Agent, or Firm*—Marger Johnson & McCollom, P.C.

(57) ABSTRACT

A fin FET structure employs a negative word line scheme. A gate electrode of a fin FET employs an electrode doped with n+ impurity, and a channel doping for a control of threshold voltage is not executed, or the channel doping is executed by a low density, thereby remarkably improving characteristics of the fin FET. A semiconductor substrate is formed in a first conductive type, and a fin active region of a first conductive type is projected from an upper surface of the semiconductor substrate and is connected to the semiconductor substrate. An insulation layer is formed on the semiconductor substrate, and a gate insulation layer is formed in upper part and sidewall of the fin active region. A gate electrode is formed on the insulation layer and the gate insulation layer. Source and drain are formed in the fin active region of both sides of the gate electrode.

25 Claims, 7 Drawing Sheets

FIN FET STRUCTURE

CROSS REFERENCE TO RELATED APPLICATIONS

This application claims priority from Korean Patent Application No. 2004-8598, filed on Feb. 10, 2004, the content of which is hereby incorporated by reference in its entirety for all purposes.

BACKGROUND OF THE INVENTION

1. Field of the Invention

This disclosure relates to a semiconductor memory device, and more particularly, to a fin Field Effect Transistor (FET) having a fin type active region.

2. Description of the Related Art

As the trend to achieve semiconductor memory devices having low power, high efficiency, and high speed characteristics continues, a design rule is continuously reduced to integrate more semiconductor memory devices into a semiconductor chip of limited size. In particular, in a highly integrated DRAM (Dynamic Random Access Memory) device, a design rule may be 100 nm, thus an interval from a gate is gradually reduced, generating a short channel effect and increasing the channel doping density of transistors constituting a memory cell. When the channel doping density of the transistors increases to a level of $10^{13}$ ion atoms/cm$^3$, a junction leakage current of a storage node lower part of a capacitor may increase, lowering the refresh characteristics.

To solve these problems, fin FETs have been manufactured by forming an active region of fin type on a semiconductor substrate and then by forming a gate electrode on the fin active region. The fin FET may employ an SOI (Silicon On Insulator) silicon substrate an interlayer insulation layer is formed in a lower part of semiconductor substrate, or a bulk silicon substrate. A fin FET that employs the SOI silicon substrate is disclosed in U.S. Pat. No. 6,525,403 entitled "SEMICONDUCTOR DEVICE HAVING MIS FIELD EFFECT TRANSISTORS OR THREE-DIMENSIONAL STRUCTURE". A method of forming a fin FET on a bulk silicon substrate is disclosed in U.S. Pat. No. 6,642,090 with the title of "FIN FET DEVICES FROM BULK SEMICONDUTOR AND METHOD FOR FORMING".

A fin FET of the type described above may use an entire face of a projected-portion as a channel. Thus, the channel length is sufficient to prevent or substantially reduce the short channel effect and improve the swing characteristics of the transistor. However, when the fin active region is less than 100 nm, the threshold voltage is difficult to control compared to a planar-type transistor or a recess-type transistor. Furthermore, a leakage current is generated in an off state of the fin FET, and a gate induced drain leakage (GIDL) and a junction leakage current are not distinctly improved compared to the planar type transistor and the recess type transistor.

Embodiments of the invention address these and other disadvantages of the conventional art.

SUMMARY OF THE INVENTION

Exemplary embodiments of the invention provide a fin FET structure using a bulk silicon substrate or an SOI silicon substrate, in which a negative bias is applied to a gate electrode under an off state of fin FET by using a negative word line scheme, thereby substantially reducing or preventing a leakage current in a channel and maintaining an off state of the channel. The structure increases a threshold voltage of the fin FET by using a gate electrode with an n+ impurity-doped electrode, without performing a channel doping for a control of threshold voltage or with performing the channel doping by a low density, thereby improving swing characteristics of the transistor and refresh characteristics. The structure also substantially reduces a junction leakage current between a storage node and a substrate, and a gate induced drain leakage (GIDL), with enhancing characteristics of the transistor.

BRIEF DESCRIPTION OF THE DRAWINGS

The above and other features of exemplary embodiments of the invention will become readily apparent from the description that follows, with reference to the attached drawings.

DETAILED DESCRIPTION OF THE INVENTION

Exemplary embodiments of the invention are more fully described in detail with reference to the accompanied drawings. The invention may be embodied in many different forms and should not be construed as being limited to the exemplary embodiments set forth herein. Rather, these exemplary embodiments are provided so that this disclosure is thorough and complete, and to convey the concept of the invention to those skilled in the art.

Figure 1:
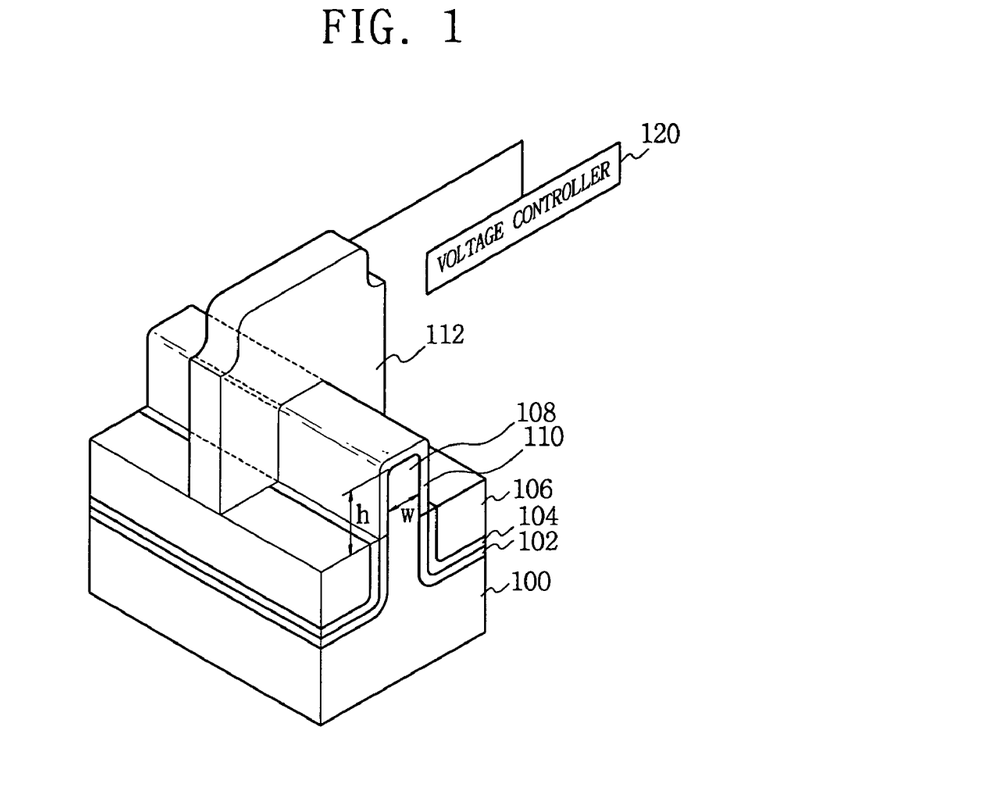
FIG. 1 is a perspective diagram illustrating a fin FET according to some embodiments of the invention.
Figure 2:
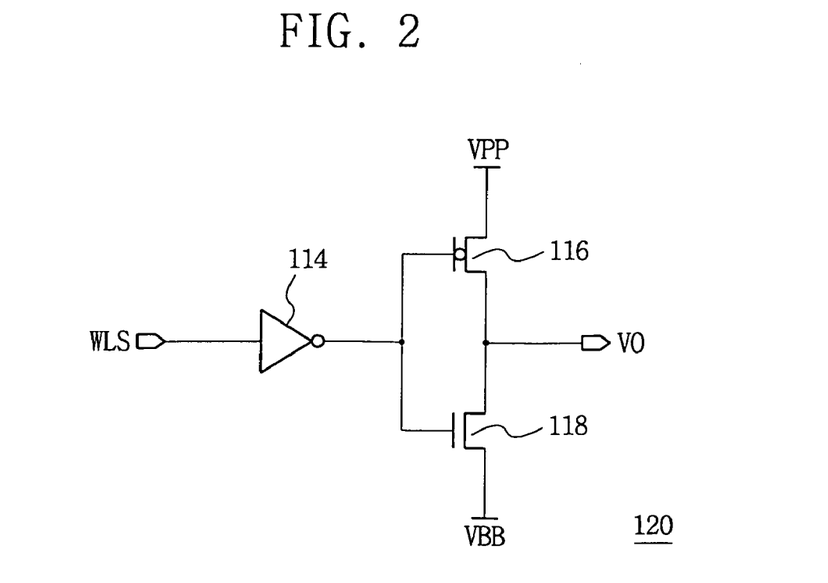
FIG. 2 is a circuit diagram illustrating an exemplary voltage controller suitable for use with the fin FET of FIG. 1.

FIG. 1 is a perspective diagram illustrating a fin FET according to some embodiments of the invention. FIG. 2 is a circuit diagram illustrating an exemplary voltage controller suitable for use with the fin FET of FIG. 1. The voltage controller will be described in relation to a write operation of a DRAM cell in using an inventive fin FET as a cell array transistor.

Referring to FIGS. 1 and 2, a semiconductor substrate 100 of a first conductive type is provided, and a fin active region 108 of a first conductive type extends from an upper surface of the semiconductor substrate. Insulation layers 102, 104, and 106 are formed on the semiconductor substrate, and a gate insulation layer 110 is formed on an upper part and sidewall of the fin active region. A gate electrode 112 is formed on the insulation layer 106 and the gate insulation layer 110. A first voltage is applied to the gate electrode 112 in a first operation state and a second voltage is applied to the gate electrode 112 in a second operation state. Furthermore, source and drain regions are formed in the fin active region 108 to both sides of the gate electrode.

The semiconductor substrate 100 may be a bulk silicon substrate. For example, the substrate 100 may be a p-type bulk silicon substrate. The fin active region 108 is connected to the semiconductor substrate, and is formed of the same conductive type as the semiconductor substrate. That is, the fin active region 108 and the semiconductor substrate may both be of the first conductive type. The fin active region 108 is defined by the device isolation film 106 that is formed by a device isolation process such as Shallow Trench Isolation (STI), etc. and has a step coverage having a predetermined height from the device isolation film 106. The fin active region 108 is formed in a shape that projects from a given region of the surface of the semiconductor substrate. The fin active region 108 may be formed to a height (h) of, e.g., about 80 nm to about 150 nm, from an upper surface of the oxide layer. A width (w) of the fin active region may be thinner than, e.g., 100 nm. A concentration of electric field on an upper edge portion of the fin active region is improved, preventing a punch-through of a channel, and an upper edge of the fin active region 108 may be rounded to uniformly form the gate insulation layer on the fin active region.

The insulation layer 106 may be a device isolation film 106 that defines the fin active region 108 and a non-active region, and the oxide layer 102 and the nitride layer 104 may be sequentially formed to surround a sidewall and a lower part of the device isolation film 106. A lower corner of the insulation layer may be rounded to prevent a turn-on effect caused by a first formed channel.

The gate electrode 112 may be formed of a polysilicon material that is doped with n+ impurity, or it may be formed of a metal material that has work function higher than the polysilicon doped with n+ impurity. The work function is defined as the energy consumed when an electron is released from a material's crystal lattice structure, and indicates a difference $\phi$ between the maximum level as a Fermi level fully filled with electrons and a potential of the outside. The gate electrode 112 may be formed by ion implanting an n+ type impurity such as phosphorus (P) or arsenic (As), etc. and may be formed to have a work function with a predetermined level by controlling the ion implantation density of the n+ impurity. For example, the gate electrode 112 may be formed to have a work function of about 4.1 eV by doping polysilicon with an n+ impurity having a predetermined density. The gate electrode 112 may also be formed of a metal such as Ti, Ta, etc. that has a work function that is higher than polysilicon doped with the n+ impurity.

The conventional art has provided a method of increasing a threshold voltage by using polysilicon doped with a p+ impurity and having a work function of 5.2 eV as a gate electrode. However, with this conventional method a uniform p-type doping for a fin structure is impossible, and the p-type impurity doped on the gate electrode may easily invade a gate oxide layer, thus causing a degradation of the gate oxide layer.

However, when gate electrodes are formed of polysilicon doped with a n+ impurity according to embodiments of the invention, the n-type impurity doped on the gate electrode cannot easily invade into the gate oxide layer, which prevents a characteristic degradation of the gate oxide layer.

In a negative word line (NWL) scheme according to embodiments of the invention, a negative bias voltage VBB is applied to the gate electrode 112 in an off state of the fin FET. In an on state of the fin FET a first voltage VPP is applied to the gate electrode to turn on a channel of the fin FET, and in an off state of the fin FET a second voltage VBB is applied to the gate electrode 112 to maintain the channel of the fin FET as the off state. The first voltage VPP is a drive voltage provided to the gate to turn on the channel of the fin FET, and the second voltage VBB is a negative bias voltage to maintain the channel of the fin FET in the off state. The negative bias voltage VBB has a voltage level that is lower than a ground voltage level, and the drive voltage VPP and the negative bias voltage VBB are provided from the voltage controller 120 that is electrically connected to the gate electrode. The voltage controller 120 will be described in detail with reference to FIG. 2.

Conventionally, in order to form a threshold voltage control region that can control a threshold voltage of a fin active region, a p-type channel doping is generally performed. On the other hand, according to some embodiments of the invention, when a gate electrode doped with n+ impurity is used and the negative word line NWL scheme is used, an additional channel doping to control the threshold voltage is unnecessary. Thus, in an exemplary embodiment of the invention, it is not required to perform the channel doping in order to control a threshold voltage. Even if the channel doping is executed, a p-type impurity is ion implanted to a low density so that a density of the threshold voltage control region is less than $1.0 \times 10^{18}$ cm$^{-3}$.

A body bias voltage of planar and recess type transistors maintains the channel in an off state, thus improving the performance of the transistor while simultaneously increasing a junction leakage current of a storage node. However, in a fin FET according to an exemplary embodiment of the invention, the negative word line NWL scheme is used to prevent a leakage current and also to maintain an off state of the channel in an off state of the fin FET. Also, a gate electrode doped with n+ impurity is used, and a channel doping for a control of threshold voltage is not executed, or the channel doping is executed with a low density, thereby increasing a threshold voltage of the fin FET under a state a back bias is 0, and improving swing and refresh characteristics of a transistor. Furthermore, a substrate density for a lower part of storage node becomes low so that a junction leakage current between the storage node and a substrate is reduced and a gate induced drain leakage (GIDL) is substantially reduced.

Source/drain regions are formed in the fin type active regions on both sides of the gate electrode by ion implanting an n-type impurity such as phosphorous (P) or arsenic (As), etc. The source/drain regions may have a LDD (Lightly Doped Drain) structure having an n+ type source/drain region of a high density and an n+ type source/drain region of a low density.

Referring to FIG. 2, the voltage controller 120 includes one inverter 114, one PMOS transistor 116, and one NMOS transistor 118. One end of the PMOS transistor 116 is connected to a first power source VPP, and another end is commonly connected with one end of the NMOS transistor 118 and an output terminal VO, and a gate of the PMOS transistor 116 is connected to the inverter 114. Another end of the NMOS transistor 118 is connected to a second power source VBB, and a gate of the NMOS transistor is connected to the iriverter 114. The inverter 114 inverts an inputted word line selection signal and provides it to gates of the PMOS and NMOS transistors 116 and 118. The output terminal VO is connected to the gate electrode 112 of FIG. 1.

When a word line selection signal WLS is enabled to perform a write operation of a DRAM memory cell, the inverter 114 outputs an "L" signal to turn on the PMOS transistor 116 and select a fin FET, then provides the first power source VPP to a gate of the selected fin FET, thus a channel is turned on and data is stored. After the write operation, when the word line selection signal WLS is disabled, the inverter outputs an "H" signal to turn on the NMOS transistor 118 and select a fin FET, and then provides the second power source VBB to a gate of the selected fin FET, thus a channel is turned off. That is, in an on state of the fin FET, data is accumulated and stored at a storage node, then in an off state of the fin FET, a negative bias voltage provided from the voltage controller is applied so that a leakage current is substantially reduced or prevented, thus an off state of the fin FET is maintained. The voltage controller 120 of FIG. 2 is merely provided as one exemplary embodiment in order to describe in detail the invention, thus the configuration of the invention may be formed by various circuits capable of providing a negative bias voltage in an off state of the fin FET.

Figure 3:
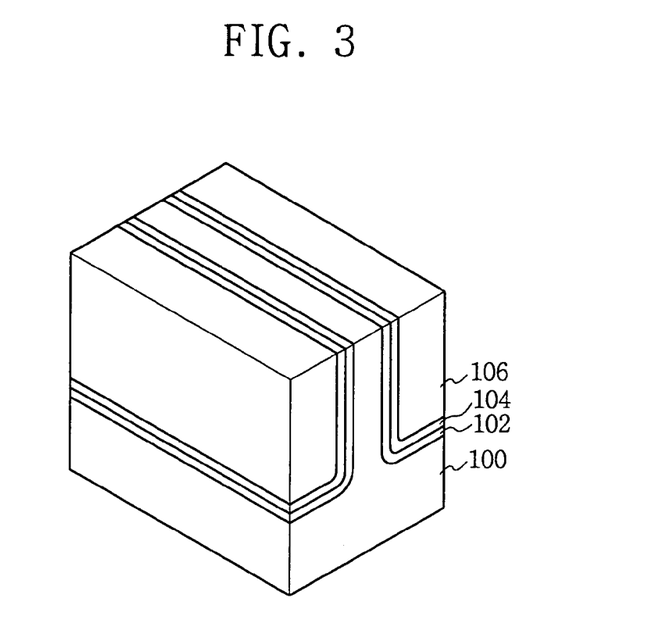
FIGS. 3, 4 and 5 are perspective diagrams that sequentially illustrate some exemplary processes for forming the fin FET of FIG. 1.
Figure 4:
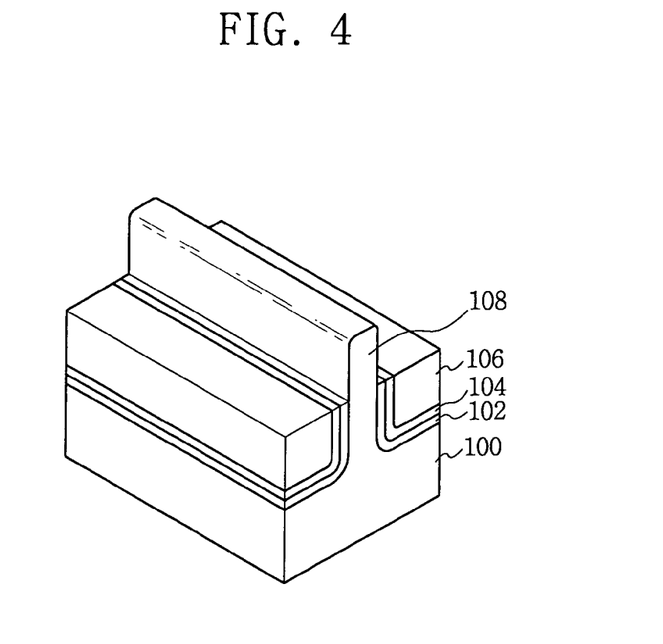
Figure 5:
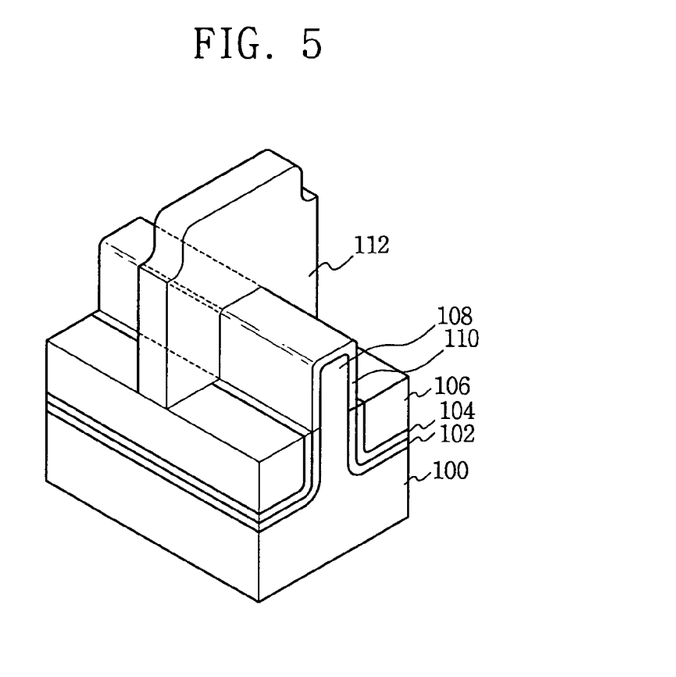

FIGS. 3, 4 and 5 are perspective diagrams that sequentially illustrate some exemplary processes for forming the fin FET of FIG. 1.

With reference to FIG. 3, a device isolation film 106 defining a non-active region and a fin active region is formed within a p-type bulk silicon substrate 100. A trench having a predetermined depth is formed in the substrate 100 through a photolithography process, and then an oxide layer 102 and a nitride layer 104 are sequentially accumulated within the trench. The oxide layer 102 functions to repair plasma damage generated during trench etching processes, to oxidize the defective portion generated by the damage, and to reduce the defect. The oxide layer 102 may be formed by using a dry oxidation among thermal oxidations that employ an $O_2$ gas that inflows at a relatively high temperature.

The nitride layer 104 functions to cut off an oxidation to prevent a substrate defect when a trench sidewall is oxidized by an additional thermal oxidation that occurs after the device isolation process and so its volume increases, and to prevent a fitting defect caused by a reaction operation of oxygen source at a lower corner portion of a trench. The nitride layer 104 may be formed through a deposition method such as a low pressure chemical vapor deposition (LPCVD), a sputtering method or an atomic layer deposition (ALD) etc. The nitride layer 104 may be formed of BN (Boron Nitride) or $Al_2O_3$ having a high density so as to form protective layer. Before accumulating the oxide layer 102 and the nitride layer 104, an isotropic etching process, e.g., a chemical dry etching (CDE) or wet etching process, may be performed within the trench in order to round a corner of the trench to prevent problems when the channel is first formed and turned on.

Subsequently, a field oxide layer is formed to fill the trench, and then a planarization process such as a chemical mechanical polishing (CMP) etc. is performed on the field oxide layer to planarize the field oxide layer and thus form the device isolation film 106 that defines an active region and a non-active region. The device isolation film or field oxide layer 106 may be formed to a depth of about 2500 Å to 3000 Å, and may be formed of any one from an oxide layer group composed of SOG, USG, BPSG, PSG, PE-TEOS and liquid oxide layer material, or may be formed of multi-layer involving two or more among the oxide layer group. The device isolation film 106 may be formed by using CVD, LPCVD, or plasma chemical vapor deposition (PE CVD) etc. and may also be formed by using a high density plasma chemical vapor deposition (HDP CVD) having a high deposition speed and prominent filling force.

Referring to FIG. 4, a photolithography process is performed to remove by a predetermined depth the device isolation film 106, and then the exposed nitride layer 104 and the exposed oxide layer 102 are sequentially removed. As its result, a fin active region 108 is formed that projects from a surface upper part of the substrate and that is surrounded by the device isolation film, with step coverage of a given height from an upper surface of the device isolation film, between the device isolation film. A height (h) of the fin active region 108 may be formed to a depth of, e.g., about 80 nm to 150 nm from an upper surface of the oxide layer, and a width (w) of the fin active region may be formed with a width thinner than, e.g., 100 nm. Also, an upper edge of the fin active region 108 may be rounded to improve an electrical field concentration onto an upper edge portion of the fin active region and to prevent a punch-through of a channel, and to uniformly form a gate insulation layer on an upper part of the fin active region. The nitride layer 104 is removed by a wet etching using $H_3PO_4$ and the oxide layer 102 is removed by a wet etching using HF.

According to some embodiments of the invention, an additional channel doping to control a threshold voltage is unnecessary and therefore is not performed. According to other embodiments of the invention, even though the channel doping is executed, p-type impurities are ion implanted at a low density so that a density of the threshold voltage control region is less than $1.0 \times 10^{18}$ cm$^{-3}$. Thus, a GIDL ofthe fin FET and a junction leakage current ofthe storage node may be substantially reduced.

Referring to FIG. 5, a gate insulation layer 110 is formed in an upper part and a sidewall of the fin active region 108, then a gate electrode 112 made of polysilicon material doped with an n+ impurity is formed. The gate insulation layer 110 is formed of oxide layer material, and may be formed by thermally oxidizing a bottom face of the recess or through a deposition method such as CVD, sputtering, etc. The gate electrode 112 is obtained by depositing a polysilicon layer on the substrate involving the gate insulation layer and the device isolation film, then by patterning a gate stack through a photolithography and etching process of the polysilicon layer. The gate electrode 112 may be obtained by ion implanting an n+ impurity such as phosphorous (P), arsenic (As), etc. into polysilicon to a density of about $10^{16}$ to $10^{18}$ ion atoms/cm$^2$. Alternatively, the gate electrode 112 may be formed of a metal material such as Ti, Ta, etc. that has a work function greater than the polysilicon doped with the n+ impurity. Then, a capping layer is formed on the gate electrode and a gate spacer may be further formed in a sidewall of the capping layer.

Subsequently, an n type impurity such as P, As, etc. is ion implanted by using the gate stack or gate spacer as an ion implantation mask, to form source/drain regions in the fin active region 108 to both sides of the gate electrode 112. In the source/drain regions, an n type impurity having a relatively low density as compared with forming n+ type source/drain regions of a high density is ion implanted at a low energy, thus first forming n-type source/drain regions of a low density, and then forming n+ type source/drain regions of a density higher than the low density on a portion of the n-type source/drain regions of the low density. Thereby, an LDD structure is obtained.

Figure 6:
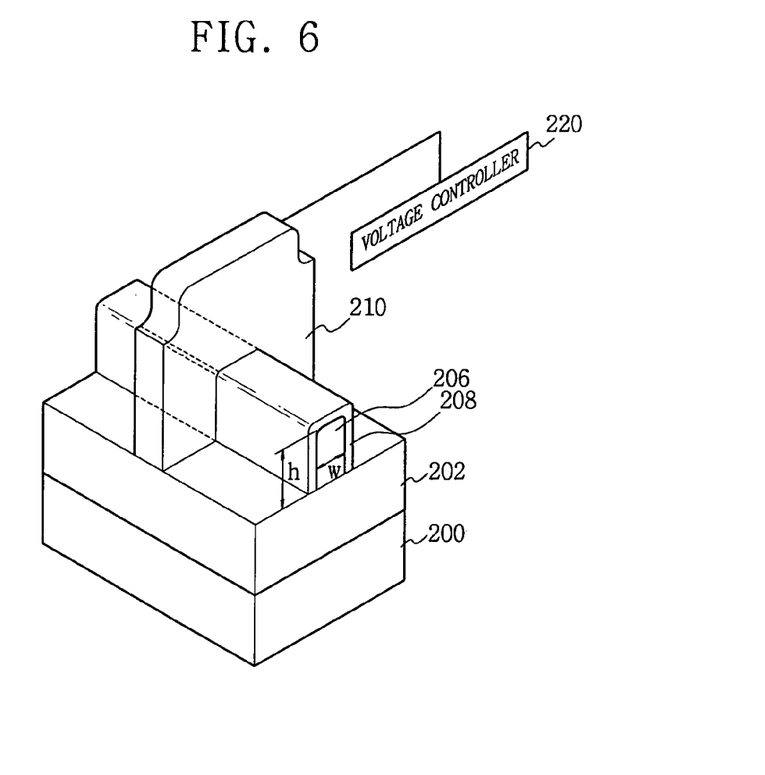
FIG. 6 is a perspective diagram illustrating a fin FET according to some other embodiments of the invention.

FIG. 6 is a perspective diagram illustrating a fin FET according to some other embodiments of the invention.

In FIG. 6, the fin FET includes a bottom substrate 200 of a first conductive type, an insulation layer 202 formed on the bottom substrate, a fin active region 206 having a shape that projects from an upper surface of the insulation layer 202, a gate insulation layer 208 formed in upper part and sidewall of the fin active region, a gate electrode 210, which is formed in the insulation layer 202 and the gate insulation layer 208 and to which a first voltage is applied in a first operation state and a second voltage is applied in a second operation state, and source and drain regions (not shown) formed in the fin active region 206 on both sides of the gate electrode.

The fin active region 206 has a step coverage of a given height with the insulation layer 202 through a photolithography and etching process performed on a top of the SOI silicon substrate, and has a shape that projects from a predetermined upper surface portion of the insulation layer. The fin active region 206 may be formed to a height (h) from an upper surface of the insulation layer 202 of, e.g., about 80 nm to about 150 nm. A width (w) of the fin active region 206 may be thinner than, e.g., 100 nm. A concentration of electric field on an upper edge portion of the fin active region is improved, preventing a punch-through of a channel, and an upper edge of the fin active region may be rounding processed to uniformly form the gate insulation layer on the fin active region.

The gate electrode 210 is formed of a polysilicon material that is doped with an n+ impurity, or the gate electrode 210 may be formed of a metal that has work function that is greater than the polysilicon doped with a n+ impurity. For example, the gate electrode 210 may be formed of a metal such as Ti, Ta, etc. that has a work function greater than polysilicon doped with the n+ impurity.

In a negative word line (NWL) scheme, a negative bias voltage VBB is applied to the gate electrode 210 in an off state of the fin FET. Then, in an on state of the fin FET a first voltage VPP is applied to the gate electrode to turn on a channel of the fin FET, and in an off state of the fin FET a second voltage VBB is applied to the gate electrode 210 to maintain the channel of the fin FET as the off state. The first voltage VPP is a drive voltage provided to the gate to turn on the channel of the fin FET, and the second voltage VBB is a negative bias voltage to maintain the channel of the fin FET in the off state. The negative bias voltage VBB has a voltage level that is less than a ground voltage level, and the drive voltage VPP and the negative bias voltage VBB are provided from a voltage controller 220 that is electrically connected to the gate electrode 210. Configuration and operation of the voltage controller 220 are similar to or the same as the voltage controller of FIG. 2, thus an unduly repetitive description is not repeated here.

The source/drain regions are formed in the fin active region 208 on both sides of the gate electrode 210, and are formed by ion implanting an n-type impurity such as P, As, etc. The source/drain regions may have an LDD structure with n+ type source/drain regions of a high density and n+ type source/drain regions of a low density.

Figure 7:
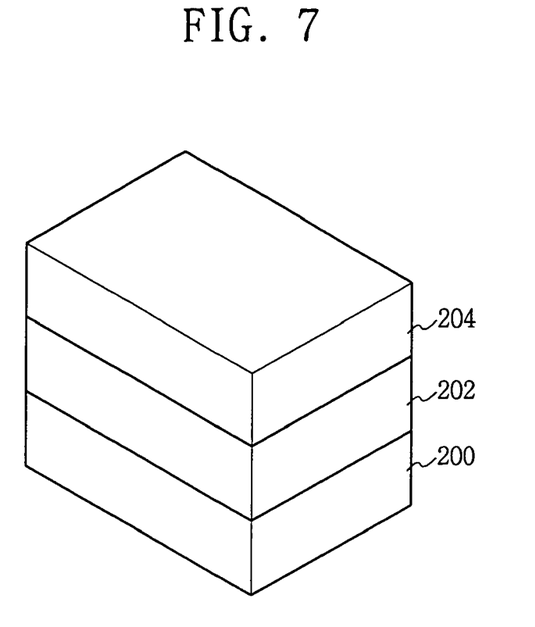
FIGS. 7, 8 and 9 are perspective diagrams that sequentially illustrate exemplary processes for forming the fin FET of FIG. 6.
Figure 8:
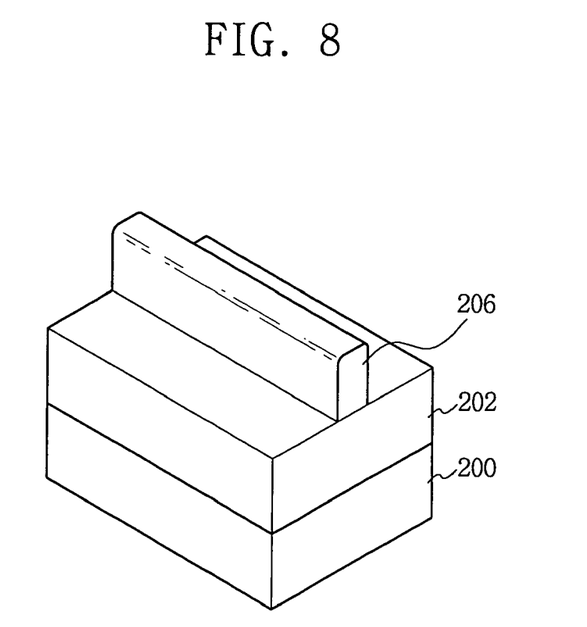
Figure 9:
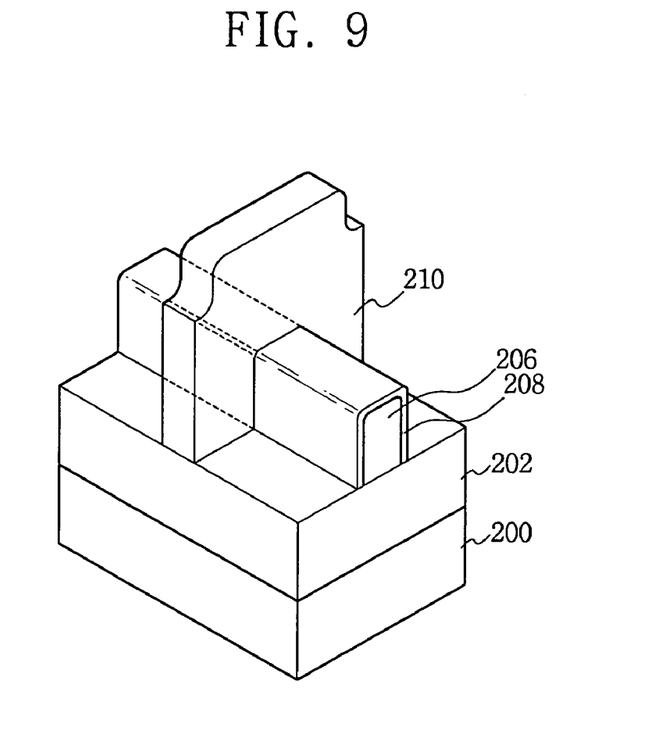

FIGS. 7, 8 and 9 are perspective diagrams that sequentially illustrate exemplary processes for forming the fin FET of FIG. 6.

In FIG. 7, the SOI silicon substrate includes a bottom substrate 200, an insulation layer 202, and a top substrate 204. The interlayer insulation layer 202 is formed of oxide layer material on the bottom substrate 200, and on the interlayer insulation layer, the top substrate 204 is formed.

In FIG. 8, a photoresist pattern(not shown) defining an active region and a non-active region is formed through a photolithography process that is performed on the SOI silicon substrate, and the top substrate 204 is etched until the insulation layer 202 is exposed by using the photoresist pattern as an etch mask, thus forming the fin active region 206. That is, the fin active region 206 is surrounded by the insulation layer 202 and has a projected shape with a step coverage having a predetermined height from an upper surface of the insulation layer 202. The fin active region 206 may be formed to a height (h) from an upper surface of the insulation layer of, e.g., about 80 nm to about 150 nm. A width (w) of the fin active region may be thinner than, e.g., 100 nm. A concentration of electric field on an upper edge portion of the fin active region is improved, preventing a punch-through of a channel, and an upper edge of the fin active region may be rounded to uniformly form the gate insulation layer on an upper part of the fin active region 206.

Next, with reference to FIG. 9, a gate insulation layer 208 is formed in an upper part and a sidewall of the fin active region 206, then a gate electrode 210 of polysilicon material doped with a n+ impurity is formed. The gate insulation layer 208 is formed of an oxide layer material, and may be formed by thermal oxidizing a bottom face of a recess or through a deposition method such as CVD, sputtering, etc. The gate electrode 210 is obtained by entirely forming polysilicon on the substrate involving the gate insulation layer 208 and the insulation layer 202, then by patterning a gate stack through a photolithography and etching process. The gate electrode 210 may be obtained by ion implanting an n+ impurity such as P, As, etc. into polysilicon. Also, the gate electrode 210 may be formed of a metal such as Ti or Ta etc. that has a work function greater than polysilicon doped with the n+ impurity. Then, a capping layer is formed on the gate electrode 210 and a gate spacer may be further formed in a sidewall of the capping layer and the gate electrode.

Subsequently, an n type impurity such as P, As, etc. is ion implanted by using the gate stack or gate spacer as an ion implantation mask, to form source/drain regions in the fin active region 206 to both sides of the gate electrode, thus resulting in forming the fin FET according to the exemplary embodiment of the invention. In the source/drain regions, an n type impurity having a relatively low density as compared with forming n+ type source/drain regions is ion implanted with low energy, thus first forming n-type source/drain regions of a low density, and then forming n+ type source/drain regions of a density higher than the low density on a portion of the n-type source/drain regions of the low density. Thus, a LDD structure may be obtained.

Figure 10:
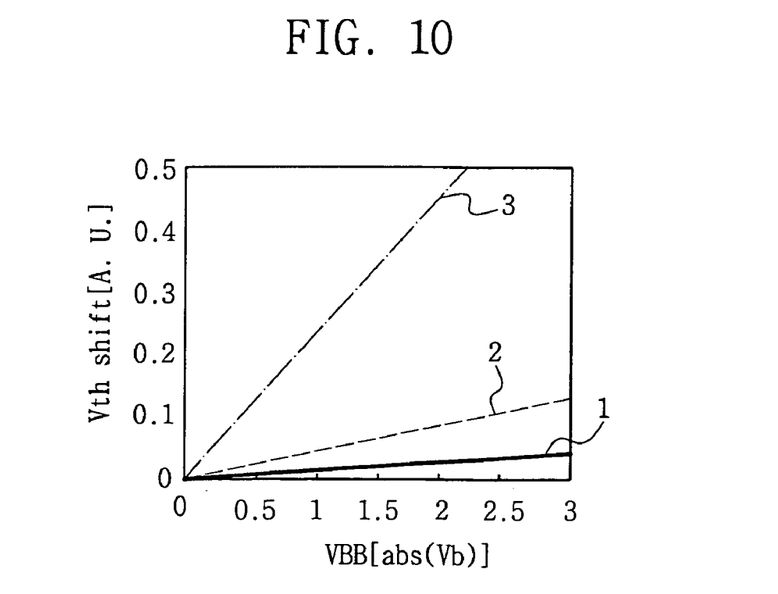
FIG. 10 is a graph illustrating the correlation between a threshold voltage (Vth) and a body bias (VBB) for a conventional fin FET, a planar-type transistor, and a recess-type transistor.

FIG. 10 is a graph illustrating the correlation between a shift in the threshold voltage (Vth) and a body bias (VBB) for a fin FET (solid line 1), a planar-type transistor (dashed line 2), and a recess-type transistor (dashed/dotted line 3). The horizontal axis of the graph indicates a bias voltage VBB and the vertical axis of the graph indicates a shift of threshold voltage.

As shown in FIG. 10, when an applied bias voltage rapidly changes from 0V to −3V (3V in absolute value), a shift of threshold voltage in the fin FET 1 is small, meanwhile, a shift of threshold voltages in the planar and the recess type transistors 2 and 3 is rapid. Thus, the dependency of the fin FET upon bias voltage is low as compared with the planar and the recess type transistors. As shown in the graph of FIG. 10 there is only a small change in performance of the transistor even when a negative bias voltage having a given level is applied in an off state of the fin FET.

Equations 1 and 2, which appear following this paragraph, illustrate that a threshold voltage of the fin FET is decided by a width of the fin active region regardless of channel doping in the fin active region. Referring to equation 1, Vth indicates a threshold voltage, ΦMS designates a work function difference between the gate and the silicon substrate, ΦF is the Fermi level, Cox is the capacitance per unit area of an oxide layer positioned between a gate and a silicon substrate, and Qd is the depletion capacitance. In equation 2, Nch designates an electron density of a channel and Tsi is the width of channel, that is, the width of the fin active region.

$$Vth = \phi_{MS} + 2\phi_F + \frac{Qd}{Cox} \quad \text{[Equation 1]}$$

$$Qd = qNch \times \frac{Tsi}{2} \quad \text{[Equation 2]}$$

In the equations 1 and 2, as the width of fin active region Tsi becomes smaller, the threshold voltage converges to 0V to −0.2.5V. That is, the threshold voltage Vth of the fin FET becomes remarkably low in comparison with the planar type transistor having the same channel doping. Such a characteristic of the fin FET will be described in more detail with reference to a graph of FIG. 11.

Figure 11:
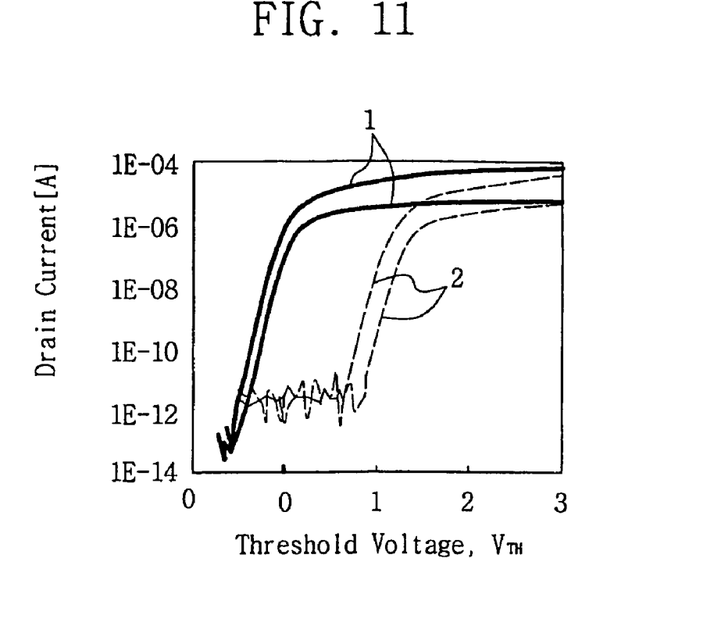
FIG. 11 is a graph illustrating drain induced barrier lowering (DIBL) effects in a fin FET and a planar type transistor.

FIG. 11 is a graph illustrating drain induced barrier lowering (DIBL) effects in a fin FET and a planar type transistor. The horizontal axis of the graph indicates a threshold voltage Vth, in volts, and the vertical axis designates the drain current Id, in amperes. FIG. 11 shows a simulation result for an exemplary fin FET (lines 1) having a fin active region width of 80 nm, a gate length of 90 nm, and a fin active region height of 100 nm. FIG. 11 also shows a simulation result for an exemplary planar type transistor (lines 2) having a gate length of 90 nm, where each drain voltage is 0.1/1.5V and a bias voltage is −0.7V.

As shown in FIG. 11, a threshold voltage of the fin FET 1 is relatively low as compared with a threshold voltage of the planar type transistor 2 having the same channel doping. In order to increase the threshold voltage of the fin FET, a conventional technique using a gate electrode doped with p+ impurity was provided, however a uniform doping of p type impurities proved impossible with the fin structure, and the p type impurity doped on the gate electrode easily invaded the gate oxide layer, causing a degradation of the gate oxide layer. Meanwhile, according to an exemplary embodiment of the invention, the fin FET employs a gate electrode of polysilicon material doped with n+ impurity, and a channel doping is not required to control the threshold voltage. Alternatively, the channel doping may be performed at a low density, thereby increasing a threshold voltage of the fin FET. Also, the gate electrode may be formed of a metal material such as Ti, Ta, etc., that has a work function greater than the polysilicon doped with the n+ impurity, thus increasing a threshold voltage of the fin FET.

Figure 12:
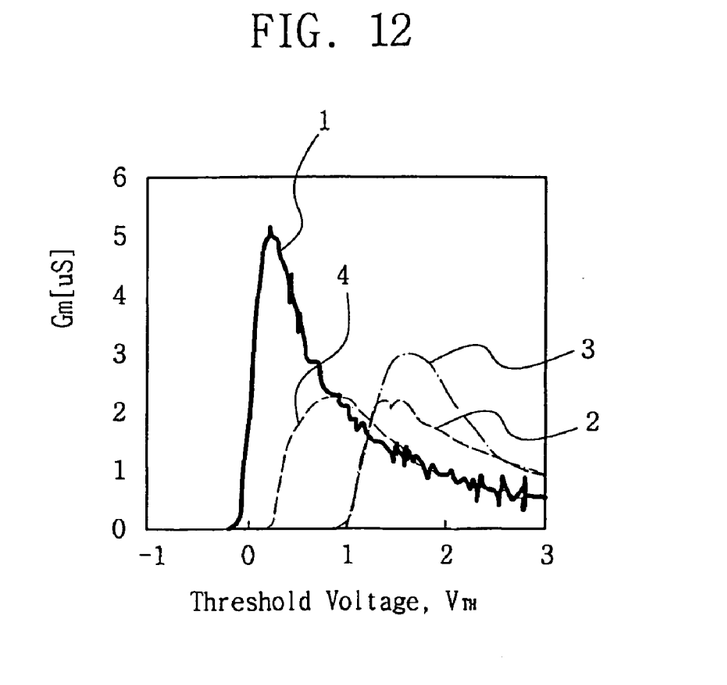
FIG. 12 is a graph illustrating the correlation between a mutual conductance (Gm) and a gate voltage (V) for a conventional planar type transistor, a conventional recess type transistor, a conventional fin FET, and a fin FET according to some embodiments of the invention.

FIG. 12 is a graph illustrating the correlation between a mutual conductance (Gm) and a gate voltage (V) for a conventional planar type transistor (line 2), a conventional recess type transistor (line 3), a conventional fin FET (line 4), and a fin FET according to some embodiments of the invention (line 1). A horizontal axis of the graph indicates a threshold voltage Vth, and a vertical axis designates a mutual conductance (Gm). According to an exemplary embodiment of the invention the fin FET is formed on a bulk silicon substrate, and the graph provides a simulation result of the fin FET under such a determination condition that a width of a fin active region is 80 nm, a gate length is 90 nm and a height of the fin active region is 100 nm, and under such a determination condition that in the planar and recess type transistors a gate length is 90 nm, each drain voltage is 0.1V and a bias voltage is −0.7V.

As shown in FIG. 12, the fin FET 1 according to an embodiment of the invention has a remarkably improved mutual conductance, in comparison with a planar type transistor 2, a recess type transistor 3, and a fin FET 4 that are based on conventional techniques.

Figure 13:
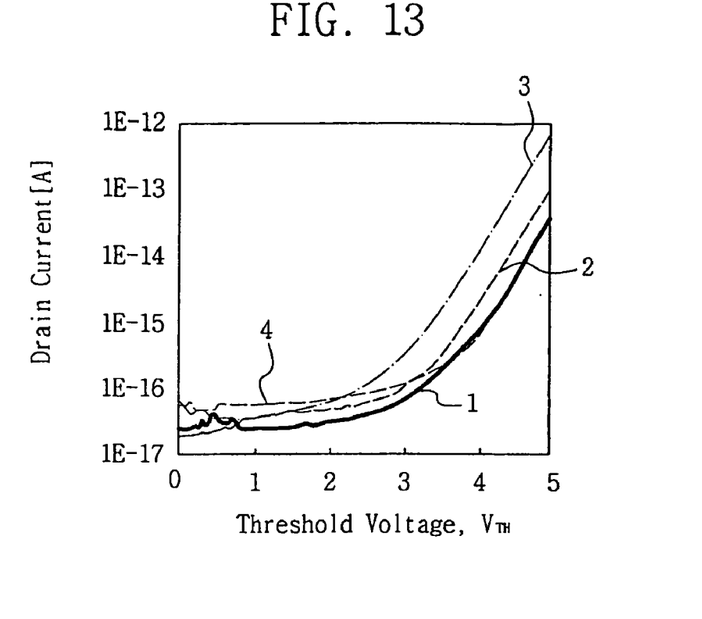
FIG. 13 is a graph illustrating the correlation between GIDL and a junction leakage current for a conventional planar type transistor, a conventional recess-type transistor, a conventional fin FET, and a fin FET according to an exemplary embodiment of the invention.

FIG. 13 is a graph illustrating the correlation between GIDL and a junction leakage current for a conventional planar type transistor (line 2), a conventional recess-type transistor (line 3), a conventional fin FET (line 4), and a fin FET according to an exemplary embodiment of the invention (line 1). The horizontal axis of the graph indicates a threshold voltage Vth and the vertical axis provides a drain current Id. A simulation condition of the graph is equal to the conditions of FIG. 12.

As shown in FIG. 13, the fin FET 1 according to an embodiment of the invention has a remarkably reduced GIDL and junction leakage current, in comparison with the conventional planar type transistor 2, the conventional recess type transistor 3, and the conventional fin FET 4.

Figure 14:
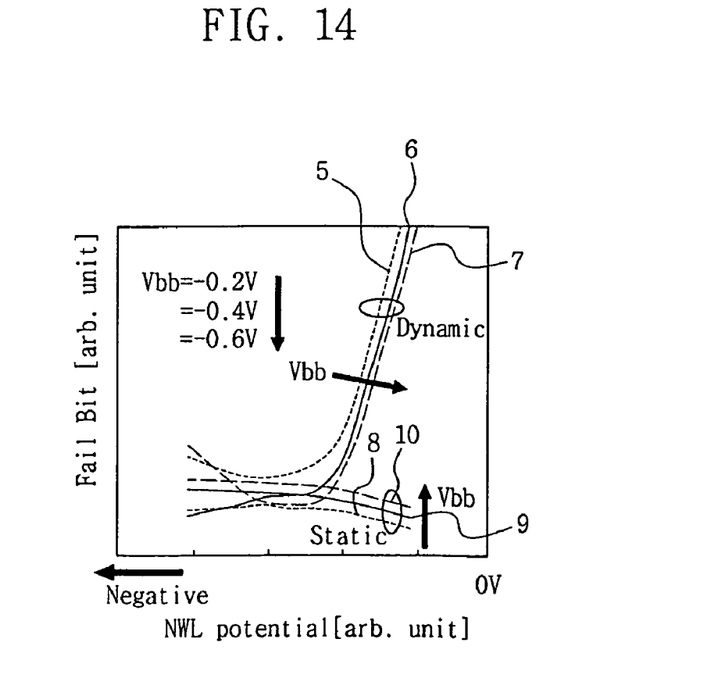
FIG. 14 is a graph illustrating the refresh characteristics of a fin FET according to an exemplary embodiment of the invention.

FIG. 14 is a graph illustrating the refresh characteristics of a fin FET according to an exemplary embodiment of the invention. The horizontal axis of the graph indicates a negative word line (NWL) potential, and a vertical axis indicates the number of failure bits. The refresh characteristic is provided as a refresh characteristic of DRAM when the fin FET according to an embodiment of the invention is used as a cell array transistor for a DRAM. In FIG. 14, the lines 5, 6, and 7 indicate refresh characteristics as dynamic failure bits when the negative bias voltages are −0.2 V, −0.4 V, and −0.6 V, respectively. The lines 8, 9, and 10 indicate refresh characteristics as static failure bits when negative bias voltages are −0.2 V, −0.4 V, and −0.6 V, respectively. As shown in FIG. 14, relatively speaking, the number of dynamic and static failure bits decrease as the negative bias voltage that is applied to a gate electrode of the fin FET becomes greater in magnitude.

According to an exemplary embodiment of the invention, a negative word line (NWL) scheme is used to apply a negative bias to a gate electrode in an off state of fin FET, thereby substantially reducing or preventing a leakage current of a channel and maintaining an off state of the channel. In addition, the gate electrode of the fin FET employs an electrode doped with n+ impurity, and a channel doping for a control of threshold voltage is not executed, or the channel doping is executed by a low density, thereby increasing a threshold voltage and improving swing and refresh characteristics of the transistor. Furthermore, a junction leakage current between a storage node and a substrate is reduced, and the GIDL is substantially reduced, improving characteristics of the transistor.

As described above, according to an exemplary embodiment of the invention, a fin FET structure using a bulk silicon substrate and an SOI silicon substrate employs a negative word line (NWL) scheme, thus substantially reducing or preventing a leakage current in a channel to maintain an off state of the channel.

In addition, a gate electrode of the fin FET employs an electrode doped with n+ impurity, and a channel doping for a control of threshold voltage is not executed, or the channel doping is executed by a low density, thereby increasing a threshold voltage, and improving swing and refresh characteristics of the transistor.

Furthermore, a junction leakage current between a storage node and a substrate, and a GIDL, can be substantially reduced, thus improving characteristics of the transistor.

Embodiments of the invention may be practiced in many ways. What follows are exemplary, non-limiting descriptions of some of these embodiments.

An embodiment of the invention provides a fin FET structure. The structure includes a semiconductor substrate of a first conductive type, a fin active region of a first conductive type projected from an upper surface of the semiconductor substrate, the fin active region being connected to the semiconductor substrate, an insulation layer formed on the semiconductor substrate, a gate insulation layer formed on an upper part and sidewall of the fin active region, a gate electrode, which is formed on the insulation layer and the gate insulation layer and to which a first voltage is applied in a first operation state and a second voltage is applied in a second operation state, and source and drain formed in the fin active region of both sides of the gate electrode.

Another embodiment of the invention provides a fin FET structure. The structure includes a bottom substrate, an insulation layer formed on the bottom substrate, a fin active region having a shape projected from an upper surface of the insulation layer, a gate insulation layer formed on an upper part and sidewall of the fin active region, a gate electrode, which is formed on the insulation layer and the gate insulation layer and to which a first voltage is applied in a first operation state and a second voltage is applied in a second operation state, and source and drain formed in the fin active region of both sides of the gate electrode.

It will be apparent to those skilled in the art that modifications and variations can be made in the present invention without deviating from the spirit or scope of the invention. For example, a fin FET may be formed by using substrate and impurity of contrary conductive type and may be constructed of a plurality of fin FETs connected to a capacitor to form a memory cell. Thus, it is intended that the invention cover any such modifications and variations of this invention provided they come within the scope of the appended claims and their equivalents.

We claim:

1. A fin field effect transistor structure comprising:
   a semiconductor substrate of a first conductive type;
   a fin active region of a first conductive type, the fin active region projecting from an upper surface of the semiconductor substrate and connected to the semiconductor substrate, wherein a width of the fin active region is less than 100 nm;
   an insulation layer formed on the semiconductor substrate;
   a gate insulation layer formed on an upper part and a sidewall of the fin active region;
   a gate electrode disposed on the insulation layer and the gate insulation layer and structured to receive a first voltage in a first operation state and a second voltage in a second operation state; and
   source/drain regions formed in the fin active region on both sides of the gate electrode.

2. The structure of claim 1, the gate electrode comprising a polysilicon material doped with impurities of a second conductive type.

3. The structure of claim 1, the gate electrode comprising a metal material having a work function that is greater than a polysilicon material doped with impurities of a second conductive type.

4. The structure of claim 1, wherein the first operation state is an on state and the second operation state is an off state.

5. The structure of claim 1, wherein the gate electrode is structured to turn on a channel of the fin FET when the first voltage is received, the first voltage comprising a drive voltage.

6. The structure of claim 1, wherein the gate electrode is structured to maintain a channel of the fin FET in an off state when the second voltage is received, the second voltage comprising a negative bias voltage.

7. The structure of claim 1, wherein the second voltage has a level lower than a ground voltage.

8. The structure of claim 1, further comprising a voltage controller structured to generate the first and second voltages and provide them to the gate.

9. The structure of claim 8, wherein the voltage controller is structured to generate and provide the first voltage when a word line selection signal is enabled, and wherein the voltage controller is structured to generate and provide the second voltage when the word line selection signal is disabled.

10. The structure of claim 1, wherein the semiconductor substrate is a bulk silicon substrate.

11. The structure of claim 1, wherein the fin active region is formed to a height that is about 80 nm to about 150 nm from an upper surface of the insulation layer.

12. The structure of claim 1, wherein the gate electrode comprises a polysilicon material doped with n-type impurities to a density such that the gate electrode has a work function of about 4.1 eV.

13. A fin field effect transistor structure comprising:
   a substrate having a first conductive type, the substrate including a fin active region that protrudes from a surface of the substrate, the fin active region having an upper surface that is substantially parallel to the surface of the substrate and a sidewall that is substantially perpendicular to the surface of the substrate, wherein a width of the fin active region is less than 100 nm;
   an oxide layer disposed on and contiguous with the surface of the substrate and the sidewall of the fin active region, the oxide layer having a surface that is substantially parallel to the surface of the substrate and having a sidewall that is substantially perpendicular to the surface of the substrate;
   a nitride layer disposed on and contiguous with the surface of the oxide layer and the sidewall of the oxide layer, the nitride layer having a surface that is substantially parallel to the surface of the substrate and having a sidewall that is substantially perpendicular to the surface of the substrate;
   an insulation layer disposed on and contiguous with the surface of the nitride layer and the sidewall of the nitride layer, the fin active region projecting from an uppermost surface of the insulation layer;
   a gate insulation layer disposed in physical contact with the upper surface of the fin active region and the sidewall of the fin active region;
   a gate electrode disposed on the insulation layer and the gate insulation layer, the gate electrode structured to receive a first voltage that is applied during a first operation state and a second voltage that is applied during a second operation state; and source/drain regions formed in the fin active region on both sides of the gate electrode.

14. The structure of claim 13, the gate electrode comprising a metal material having a work function that is higher than a polysilicon material doped with a second conductive impurity.

15. The structure of claim 13, wherein the first operation state is an on state and the second operation state is an off state.

16. The structure of claim 13, wherein the first voltage is a drive voltage that turns on a channel of the fin FET.

17. The structure of claim 13, wherein the second voltage is a negative bias voltage that is provided to a gate in order to maintain an off state of a channel of the fin FET.

18. The structure of claim 13, wherein the second voltage has a level that is lower than a ground voltage.

19. The structure of claim 13, further comprising a voltage controller configured to generate the first and second voltages and provide them to the gate.

20. The structure of claim 19, wherein the voltage controller is configured to generate and provide the first voltage when a word line selection signal is enabled, and is configured to generate and provide the second voltage when the word line selection signal is disabled.

21. The structure of claim 13, wherein the fin active region is formed to a height of about 80 nm to about 150 nm from an upper surface of the insulation layer.

22. The structure of claim 13, the gate insulation layer disposed in physical contact with an uppermost surface of the oxide layer.

23. The structure of claim 22, an uppermost surface of the nitride layer substantially coplanar with the uppermost surface of the oxide layer and the uppermost surface of the insulation layer.

24. The structure of claim 23, the gate electrode disposed in physical contact with the uppermost surface of the insulation layer and the uppermost surface of the nitride layer.

25. The structure of claim 13, the gate electrode comprising a polysilicon material doped with impurities of a second conductive type.

* * * * *

UNITED STATES PATENT AND TRADEMARK OFFICE
CERTIFICATE OF CORRECTION

PATENT NO. : 7,317,230 B2  Page 1 of 1
APPLICATION NO. : 11/041063
DATED : January 8, 2008
INVENTOR(S) : Choong-Ho Lee et al.

It is certified that error appears in the above-identified patent and that said Letters Patent is hereby corrected as shown below:

Column 5, line 6, the word "iriverter" should read -- inverter --;
Column 6, line 39, the words "ofthe fin" should read -- of the fin --;
Column 6, line 39, the words "ofthe storage" should read -- of the storage --.

Signed and Sealed this

Thirtieth Day of September, 2008

JON W. DUDAS
*Director of the United States Patent and Trademark Office*